United States Patent

Takagami et al.

[11] Patent Number: 5,916,734
[45] Date of Patent: Jun. 29, 1999

[54] METHOD FOR MAKING LITHOGRAPHIC PRINTING PLATE

[75] Inventors: Yuji Takagami; Hideaki Ishiguro; Kenji Hyodo, all of Tokyo, Japan

[73] Assignee: Mitsubishi Paper Mills Limited, Tokyo, Japan

[21] Appl. No.: 08/964,016

[22] Filed: Nov. 4, 1997

[30] Foreign Application Priority Data

Nov. 5, 1996 [JP] Japan ................... 8-292537
Oct. 3, 1997 [JP] Japan ................... 9-270854

[51] Int. Cl.$^6$ .................. G03F 7/36; G03C 8/06
[52] U.S. Cl. ............. 430/302; 430/204; 430/273.1; 430/276.1; 430/330; 430/416; 430/616; 430/945; 430/964
[58] Field of Search ................... 430/616, 204, 430/276.1, 964, 302, 330, 945, 416, 273.1

[56] References Cited

U.S. PATENT DOCUMENTS

| | | | |
|---|---|---|---|
| 4,278,756 | 7/1981 | Bouldin et al. | 430/616 |
| 4,278,758 | 7/1981 | Drexler et al. | 430/616 |
| 4,284,716 | 8/1981 | Drexler et al. | 430/616 |
| 4,314,260 | 2/1982 | Drexler | 430/616 |
| 4,363,870 | 12/1982 | Bouldin | 430/616 |
| 4,465,767 | 8/1984 | Oba et al. | 430/276.1 |
| 5,401,611 | 3/1995 | Edwards et al. | 430/616 |
| 5,437,957 | 8/1995 | Yamano et al. | 430/204 |

FOREIGN PATENT DOCUMENTS 50-113307  9/1975  Japan ................. B41C 1/10

*Primary Examiner*—Richard L. Schilling
*Attorney, Agent, or Firm*—Pillsbury Madison & Sutro LLP

[57] ABSTRACT

Provided is a method for making a lithographic printing plate according to which the area of a silver thin film of non-image area of a lithographic printing plate material comprising a support, at least a hydrophilic layer on the support and a silver thin film on the hydrophilic layer is exposed by laser beams to be fused and/or decomposed by heat transformed from laser energy thereby to disclose the hydrophilic layer.

6 Claims, 1 Drawing Sheet

(a)

(a)

(b)

METHOD FOR MAKING LITHOGRAPHIC PRINTING PLATE

BACKGROUND OF THE INVENTION

The present invention relates to a method for making printing plates used for lithographic printing which can perform imaging by laser under roomlight, requires no processing solutions, provides images of high resolution, and especially is low in production cost.

A lithographic printing plate comprises an oleophilic image area which is receptive to inks and an hydrophilic non-image area which is not receptive to the inks. The conventional lithographic printing is carried out by feeding both water and ink to the surface of the printing plate to allow the image area to receive preferentially the ink and the non-image area to receive preferentially water, and then transferring the ink on the image area onto a receiver such as paper.

At present, lithographic printing plates are made by providing an oleophilic ink-receptive layer on a substrate such as aluminum sheet, zinc sheet and paper, the surface of which are rendered hydrophilic. In presensitized plates, a photosensitive compound such as diazo compound or photopolymer is applied onto a metallic support the surface of which is rendered hydrophilic. In silver diffusion transfer material, images are formed onto a paper or plastic support by silver diffusion transfer process (DTR process).

According to the method of forming an ink-receptive layer (hereinafter referred to as "image layer") using a diazo compound or photopolymer, first a photosensitive substance such as diazo compound or photopolymer is coated on a substrate such as a metal, paper, laminate, or insulation base. Then, this is exposed to light to allow the photosensitive compound to undergo chemical change, thereby to cause change in solubility of the photosensitive compound in developers. The photosensitive compounds are classified into two depending on the kind of the chemical change. One is negative type in which the area exposed to light is polymerized and cured to become insoluble in developer and another is positive type in which functional group of the area exposed to light changes to have solubility in developer. In both the cases, the image layer comprises the photosensitive compound insoluble in developer which remains on the substrate after processed with developer.

On the other hand, lithographic printing plates made utilizing DTR process, for example, lithographic printing plates having a physical development nuclei layer on a silver halide emulsion layer are disclosed in U.S. Pat. Nos. 3,728,114, 4,134,769, 4,160,670, 4,336,321, 4,501,811, 4,510,228 and 4,621,041. The exposed silver halide crystals are developed chemically by DTR developer to become black, and the exposed area is turned to a hydrophilic non-image area. Unexposed silver halide crystals become a silver salt complex with a silver halide solvent contained in the developer, which diffuses to the surface physical development nuclei layer and undergoes physical development in the presence of the nuclei to form an image area mainly composed of an ink receptive silver. Furthermore, JP-A-63-260491, JP-A-3-116151 and JP-A-4-282295 disclose lithographic printing plates comprising a grained and anodized aluminum base as a support, a physical development nuclei layer and a silver halide emulsion layer coated on the base in succession. These lithographic printing plates are exposed imagewisely and developed in DTR developer, and then the silver halide emulsion layer is washed off with warm water, and the unexposed area is turned to an image area mainly composed of physical development silver on the anodized aluminum base.

In case an image is formed using the above-mentioned photosensitive materials, the method of exposure is one of important factors which determine resolution. Hitherto, in the conventional method presensitized plates are subjected to contact exposure with ultraviolet light or white light through a final film made in the prepress. However, computer-to-plate technology are being developed in which digital data are input, paginated and output to the laser sensitive plate without a final film. The laser direct imaging method has many merits such as low cost, time saving and high productivity for printing production with the trend to a variety of small runs.

In order to employ this laser direct imaging method, the sensitivity of photosensitive materials must be enhanced. In the case of diazo compounds or photopolymers, photochemical reaction is involved and hence they have low sensitivity, namely, several to several hundred $mJ/cm^2$. Therefore, laser source of high output must be used and there are problems that the apparatuses used are large and the cost is high.

In the silver diffusion transfer technology, the laser sensitive plates are available to the conventional laser diode imagesetter, as its sensitivity is several $\mu J/cm^2$, but there are problems that efficiency of production and plate making operation is seriously deteriorated because coating step on the substrate and storage of the materials before exposure must be in the dark or under safelight. Moreover, in the case of diazo compounds and photopolymers, reaction also proceeds under roomlight or sunlight, and, besides, change in reactivity also occurs under high temperatures. Furthermore, if oxygen is present, this serves as an inhibitor for the reaction. Therefore, the materials must also be stored in the dark or in the state of low oxygen content before exposure and development. Furthermore, according to the above methods for the image formation, a processing such as developing solution is generally carried out, and disposal of waste solution is an environmental problem.

SUMMARY OF THE INVENTION

The object of the present invention is to provide a method for making a printing plate for lithographic printing which can form images of high resolution even under roomlight, can employ a direct imaging with laser, and produces no waste solution, namely, is markedly superior in operability.

DESCRIPTION OF THE INVENTION

Figure 1:
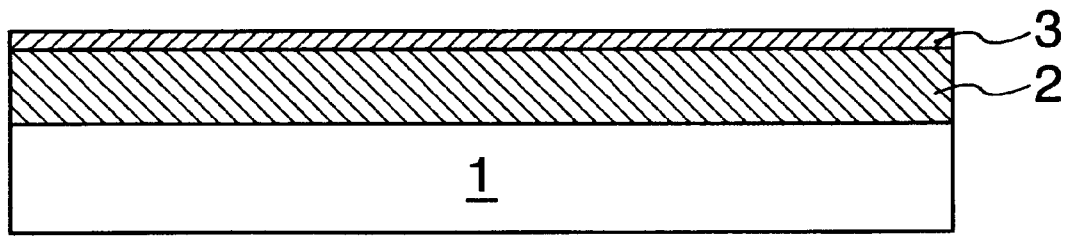
FIGS. 1 and 2 are schematic views of materials from which lithographic printing plates are made (hereinafter referred to as "lithographic printing plate materials") according to the present invention.

The method for making a lithographic printing plate of the present invention comprises exposing by laser a silver thin film of a lithographic printing plate material which comprises a support, at least a hydrophilic layer on the support and a silver thin film on the hydrophilic layer. The exposed silver thin film is removed and the hydrophilic layer is disclosed. The silver thin film is hydrophobic and the exposed area of the disclosed hydrophilic layer is, of course, hydrophilic. Thus, there are produced an ink-receptive area and an ink-repellent (water-receptive) area depending on whether the area is subjected to the exposing by laser or not. That is, when a printing plate is made by the method of the present invention, the silver thin film which is exposed by laser is fused to become fine particles or is removed by a removing device to disclose the underneath hydrophilic layer, which serves as an ink-repellent (water-receptive) non-image area, and the silver thin film of the unexposed area remains as it is and serves as an ink-receptive image area. Thus, the resulting printing plate can be used for lithographic printing.

Furthermore, according to the method for making a lithographic printing plate of the present second invention, the silver thin film of the above-mentioned lithographic printing plate material comprises physical development silver produced by silver diffusion transfer process. The silver thin film formed by physical development according to silver diffusion transfer process is higher in laser beam absorption rate, oleophilicity and ink receptivity in comparison with one formed by vapor deposition method and the like. Thus, performance as a lithographic printing plate is further improved.

According to the method for making a lithographic printing plate of the present third invention, the above-mentioned lithographic printing plate material comprises a support and a hydrophilic silver halide emulsion layer and a physical development nuclei layer provided in succession in this order on the support and this material is subjected to development without exposure by silver diffusion transfer process, whereby physical development silver is formed on the surface in the form of a layer. According to this method, since the lithographic printing plate material is a single sheet material, the physically developed silver thin film can be simply formed on the surface of the hydrophilic layer, and, moreover, adhesion between the silver thin film and the hydrophilic layer is strong, and printing endurance of the resulting lithographic printing plate is improved.

According to the method for making a lithographic printing plate of the present fourth invention, the above-mentioned lithographic printing plate material comprises a support and a physical development nuclei layer containing a hydrophilic polymer (which serves also as a hydrophilic layer) provided on the support and a silver halide emulsion layer provided thereon and this material is subjected to development without exposure by silver diffusion transfer process and the silver halide emulsion layer is washed off, whereby physical development silver is formed on the physical development nuclei in the form of a layer. According to this method, also, in the single sheet lithographic printing plate material, the physically developed silver thin film can be simply formed on the surface of an anodized aluminum, and, moreover, adhesion between the silver thin film and the aluminum surface is strong, and printing endurance of the resulting lithographic printing plate is improved.

According to the method for making a lithographic printing plate of the present fifth invention, the physical development nuclei layer and/or a layer contiguous thereto of the above-mentioned lithographic printing plate material contains at least one polymer represented by the following formula (1). By containing the acrylamide polymer represented by the formula (1), the water-receptivity (hydrophilic performance) during lithographic printing can be maintained for a long period of time and ink is repelled, and satisfactory printing with no toning of non-image portion (staining of background part) can be performed. Content of the polymer of the formula (1) is preferably 300 mg/m² or less, more preferably 2–150 mg/m².

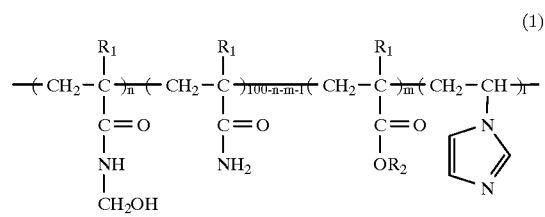

(wherein $R_1$ represents a hydrogen atom or an alkyl group, $R_2$ represents a hydrogen atom or an alkali metal atom, n is 1–100 mol %, m is 0–50 mol %, and l is 0–5 mol %, and average molecular weight is 2000–300000.)

Moreover, according to the method for making a lithographic printing plate of the present sixth invention, the hydrophilic layer of the above-mentioned lithographic printing plate material contains a light absorber. According to this method, energy of heat, light or the like produced by laser beams which transmits through the silver thin film is efficiently absorbed and the hydrophilic layer can be efficiently exposed. Therefore, it becomes possible to use a laser of lower output or to increase the imaging speed of laser. For this reason, cost for apparatus can be reduced and operational efficiency can be improved.

The light absorbers can be dyes or pigments having an absorbing wavelength which nearly meets with the emission wavelength of the laser used, but preferred are those of black color such as carbon black which can absorb a light in a wide wavelength region.

According to the present invention, lithographic printing plates can be conveniently made by carrying out exposing by laser in the form of the desired images without using a liquid developer or an processer including it. Furthermore, operation including the plate making step from lithographic printing plate materials and printing step can be conducted under roomlight, and, moreover, long-term stable storage under roomlight or in the presence of oxygen becomes possible.

Embodiments of the present invention will be explained referring to the drawings.

FIG. 1 is a schematic sectional view of one example of the lithographic printing plate material according to the present invention. The lithographic printing plate material (a) according to the present invention comprises support 1, hydrophilic layer 2 provided on the support and silver thin film 3 provided on the hydrophilic layer. For making lithographic printing plates by the present invention, the lithographic printing plate material (a) is subjected to imagewise exposure with laser beams (exposure of non-image area). The area of silver thin film 3 which has been exposed with laser beams is fused for the hydrophilic layer 2 to be disclosed. Thus, the plate making process is completed. Thereafter, when this is set in a lithographic printing press, the remaining area of the silver thin film 3 receives ink and the exposed hydrophilic layer 2 receives water, and lithographic printing becomes possible.

According to observation by an electron microscope before and after exposing by laser, it can be confirmed that the area of the silver thin film exposed by laser is fused with heat transformed from infrared light and becomes particulate (becomes silver fine particles) and the hydrophilic layer 2 beneath this area of the silver thin film is disclosed.

Figure 2:
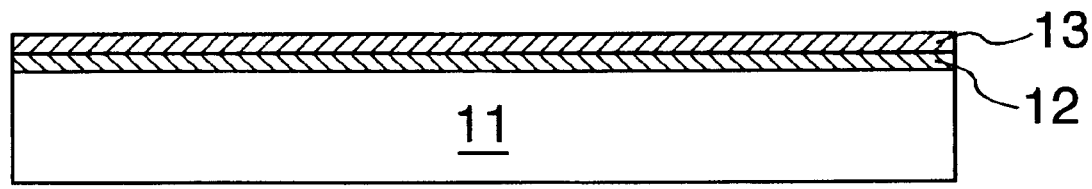

FIG. 2 is also a schematic sectional view of one example of the lithographic printing plate material according to the present invention. The lithographic printing plate material (b) according to the present invention comprises an anodized aluminum 11, a thin hydrophilic layer 12 provided on the surface of the aluminum 11 and a silver thin film 13 provided on the hydrophilic layer 12. It is assumed that since the hydrophilic layer is a thin layer, in many cases, the silver thin film produced by DTR and the hydrophilic layer are intermixed and the silver particles contact with the surface of the anodized aluminum. For making lithographic printing plates by the present invention, the material (b) is subjected to imagewise irradiation with laser beams (exposure of non-image portion). The area of silver thin film 13 which has been exposed with laser beams is removed by a removing device, whereby the hydrophilic layer 12 or the anodized aluminum surface of a support is exposed. Thus, the plate making process is completed. Thereafter, when this is set in a lithographic printing press, the remaining area of the silver thin film 13 receives ink and the disclosed hydrophilic layer 12 receives water, and lithographic printing becomes possible.

The silver thin film of the lithographic printing plate material of the present invention can be formed by general methods for the formation of metallic thin films such as vacuum deposition, sputtering, CVD and plating. Furthermore, the silver thin film can also be formed by the method including physical development in accordance with silver diffusion transfer process. In the case of this method, the silver thin film which is an image area when used as printing plate contains not only pure metallic silver, but also so-called oleophilic foreign matters such as oxides and sulfides, and furthermore the silver thin film is a continuous film, but microscopically has proper surface irregularities. Therefore, ink receptivity is superior, laser beam absorption rate increases and sensitivity as lithographic printing plate materials is improved as compared with other methods. In addition, industrial mass production can be easily attained. Thus, this is a preferred embodiment.

In the case of using the silver diffusion transfer process, there are the following embodiments. That is, one is two-sheet type according to which one sheet is the lithographic printing plate material of the present invention comprising a support, a hydrophilic layer provided on the support and a physical development nuclei layer provided on the hydrophilic layer and another sheet comprises a support and a silver halide emulsion layer provided on the support, and the surfaces of both the sheets are brought into close contact, followed by carrying out development to form a physically developed silver thin film on the hydrophilic layer. Another is a mono-sheet type, namely, a silver halide emulsion layer (which may also serve as the hydrophilic layer of the present invention) and a physical development nuclei layer are coated on one support, and physical development is carried out in the single sheet to form a silver thin film on the surface. Further another embodiment comprises coating a physical development nuclei layer (which may also serve as the hydrophilic layer of the present invention) and a silver halide emulsion layer mainly on an anodized aluminum base, and physical development is carried out in the single sheet, followed by washing off the silver halide emulsion layer to form a silver thin film on the physical development nuclei. The mono-sheet type is preferred because the distance of diffusion from the silver halide emulsion layer is short and hence diffusion in lateral direction is less, and thus a high resolving power is obtained. Commercially available products usable as the lithographic printing plate materials utilizing silver complex diffusion transfer process according to the present invention are Silver Master and Silver Degiplate (trademarks for the products of Mitsubishi Paper Mills Ltd.) and Silverlith SDB (trademark for the product of DuPont de Nemours, E. I., Co.). These can be effectively used in the present invention by subjecting them to development without exposure.

In the method for making lithographic printing plate according to the present invention, the efficiency to expose the hydrophilic layer by accelerating the fusion with heat of the silver thin film or the efficiency to remove the silver thin film (which can be said to be sensitivity of the lithographic printing plate material in the method of the present invention) depends on the thickness of the silver thin film. The thinner is the film, the poorer is printing endurance. Therefore, it is preferred to determine thickness of the silver thin film in accordance with the laser output used for imaging. When the output is 1 W or more, a thicker film can be provided, but when it is less than 1 W, it is preferred to provide the film at a thickness of 0.1–5 $\mu$m.

As described in "INSATSU KOGAKU BINRAN (Handbook of Printing Engineering)" edited by Japan Printing Society, pages 504–507, it is known to use a grained and anodized aluminum base as a support of printing plate. It is also suggested that a hydrophilic layer can be provided by subjecting the base to after-treatments after the anodization or application of gum. For industrially simply producing the hydrophilic layer as compared with the method of graining and anodizing the surface of aluminum base, the hydrophilic layer is composed mainly of a hydrophilic polymer having film-formability according to the present invention. The hydrophilic layer may comprise a plurality of layers including subbing layer or a backcoat layer may be provided on another side of the support. Amount of the hydrophilic polymer constituting the hydrophilic layer is preferably 0.5–10 g/m$^2$ per one layer.

Examples of the hydrophilic polymer are shown below and these may be used in admixture of two or more considering printing performances such as toning and printing endurance.

Examples of natural products are starches, products obtained from algae such as seaweed mannan, agar-agar and sodium alginate, vegetable mucilages such as mannan, pectin, tragacanth gum, karaya gum, xanthine gum, guar bean gum, locust bean gum and gum arabic, homopolysaccharides such as dextran, glucan, xanthane gum and levan, microorganism mucilages, e.g., heteropolysaccharides such as succinoglucan, pullulan, curdlan, xanthane gum, proteins such as glue, gelatin, casein and collagen, chitin and derivatives thereof, and the like.

Examples of semi-natural products (semisynthetic products) are cellulose derivatives, modified gums such as carboxymethyl guar gum, and processed starches such as roasted starches, e.g., dextrin, oxidized starches and esterified starches.

Examples of synthetic products are polyvinyl alcohol, modified polyvinyl alcohols such as partially acetalated polyvinyl alcohol, allyl-modified polyvinyl alcohol, polyvinylmethyl ether, polyvinylethyl ether and polyvinylisobutyl ether, polyacrylic acid derivatives and polymethacrylic acid derivatives such as polyacrylic salts, polyacrylic ester partial saponification products, polymethacrylic salts and polyacrylamide, polyethylene glycol, polyethylene oxide, polyvinyl pyrrolidone, polyvinyl pyrrolidone/vinyl acetate copolymer, carboxyvinyl polymer, styrene/maleic acid copolymer, and styrene/crotonic acid copolymer.

Among these hydrophilic polymers, gelatin is preferred when the silver halide emulsion layer also serves as the hydrophilic layer for the formation of silver thin film by silver diffusion transfer process.

As gelatins used in the hydrophilic layer of the lithographic printing plate materials of the present invention, all of those which are prepared from collagen of animals can be used, but preferred are those which are prepared from collagen obtained from pig skin, beef skin and beef bone. Gelatin is not limited, and in addition to lime-treated gelatins and acid-treated gelatins, there may further be used gelatin derivatives disclosed in JP-B-38-4854, JP-B-39-5514, JP-B-40-12237, JP-B-42-26345, U.S. Pat. Nos. 2,525,753, 2,594,293, 2,614,928, 2,763,639, 3,118,766, 3,132,945, 3,186,846, 3,312,553, and British Patent No. 1,033,189. These may be used each alone or in combination of two or more.

When gelatin is used in the hydrophilic layer, it can be hardened with a gelatin hardener. As the gelatin hardener, there may be used one or more of various compounds, e.g., inorganic compounds such as chrome alum, aldehydes such as formalin, glyoxal, malealdehyde and glutaraldehyde, N-methylal compounds such as urea and ethyleneurea, aldehyde analogous compounds such as muchochloric acid and 2,3-dihydroxy-1,4-dioxane, compounds having active halogens such as 2,4-dichloro-6-hydroxy-S-triazine salt and 2,4-dihydroxy-6-chloro-S-triazine salt, divinyl sulfone, divinyl ketone, N, N, N-triacryloylhexahydrotriazine, compounds having two or more of ethyleneimino groups or epoxy groups in the molecule which are active 3-membered rings, and dialdehyde starch as polymeric hardeners.

As the silver halide used in the case of the silver halide emulsion layer serves as the hydrophilic layer, there may be used, for example, silver chloride, silver bromide, silver chlorobromide and these silver halides containing silver iodide. These are used in the form of crystal. The silver halide crystal may contain heavy metal salts such as rhodium salts, iridium salts, palladium salts, ruthenium salts, nickel salts and platinum salts, and amount thereof is $10^{-8}$–$10^{-3}$ mol per 1 mol of silver halide. Crystal form of the silver halide has no special limitation, and the crystal may be cubic or cubo-octahedron grains, and, moreover, may be in the form of core-shell or tabular gains. The silver halide crystal may be monodispersed or polydispersed crystal, and average grain size thereof is 0.2–0.8 $\mu$m. One preferred example is monodispersed or polydispersed crystal comprising 80 mol % or more of silver chloride and containing a rhodium salt or iridium salt.

In the case of mono-sheet type, the physical development nuclei for carrying out physical development may be contained in a surface layer (physical development nuclei layer) present above the silver halide emulsion layer as the hydrophilic layer or provided between the support and the silver halide emulsion layer. For example, the physical development nuclei layer may be provided on an aluminum support previously subjected to anodizing treatment. In this case, the hydrophilic polymer may be contained in this layer and this layer may serve as a hydrophilic layer. In the case of two-sheet type, the physical development nuclei may be present above the hydrophilic layer of a sheet used as the lithographic printing plate material. The physical development nuclei include, for example, metal colloid fine particles such as silver, antimony, bismuth, cadmium, cobalt, lead, nickel, palladium, rhodium, gold and platinum, sulfides, polysulfides and selenides of these metals and mixtures and mixed crystals thereof. When the physical development nuclei layer contains hydrophilic binders, they may be hydrophilic polymers such as gelatin, starch, dialdehyde starch, carboxymethyl cellulose, gum arabic, sodium alginate, hydroxyethyl cellulose, polystyrenesulfonic acid, sodium polyacrylate, vinyl imidazole-acrylamide copolymer, acrylic acid-acrylamide copolymer, and polyvinyl alcohol or oligomers thereof. Content thereof is preferably 0.5 g/m² or less. The physical development nuclei layer may further contain developing agents such as hydroquinone, methylhydroquinone and catechol and known hardeners such as formalin and dichloro-S-triazine.

Content of the acrylamide polymer represented by the formula (1) in the lithographic printing plate material is preferably 300 mg/m² or less, more preferably 2–150 mg/m².

Inorganic materials such as titanium oxide, silicon dioxide and aluminum oxide may be contained in the hydrophilic layer of the lithographic printing plate material according to the present invention for inhibiting occurrence of toning. Amount of them is optionally determined in the desired range depending on various conditions such as printing ink, fountain solution, printing speed and printing pressure.

Furthermore, some of anionic, cationic or nonionic surface active agents may be used as aids for coating the hydrophilic layer of the lithographic printing plate material. Moreover, matting agents, thickening agents, antistatic agents and the like may also be used.

The supports of the lithographic printing plate material may be any of those which can stand lithographic printing, such as synthetic or semisynthetic polymer films such as resin coated paper, synthetic paper, polyethylene terephthalate film, and metal sheets such as aluminum and iron. The surface of these supports can be subjected to surface treatment for enhancing adhesion to a layer coated as an upper layer, and besides, they can contain solid fine particles and can be subjected to treatment with dyes for improving laser beam absorbability.

Furthermore, a layer containing a matting agent or antistatic agent may be provided on the back side of the supports taking into consideration the transporting property in imaging apparatus.

When the silver thin layer of the lithographic printing plate material is formed by silver diffusion transfer process, the production steps such as coating of the silver halide emulsion layer and development for the formation the silver thin film are carried out in a darkroom not so as to cause fogging of the silver halide emulsion. This development can be carried out continuously as a later step after production of the lithographic printing plate material.

The development processing solution for the formation of the silver thin film may contain alkaline substances such as sodium hydroxide, potassium hydroxide, lithium hydroxide and trisodium phosphate, preservatives such as sulfites, silver halide solvents such as thiosulfates, thiocyanates, cyclic imides, 2-mercaptobenzoic acid and amines, thickeners such as hydroxyethyl cellulose and carboxymethyl cellulose, antifoggants such as potassium bromide and compounds described in JP-A-47-26201, developing agents such as hydroquinones, catechol and 1-phenyl-3-pyrazolidone, and development modifiers such as polyoxyalkylene compounds and onium compounds. Furthermore, the development processing solution can contain compounds for improving ink receptivity of the surface silver thin film, such as those which are mentioned in U.S. Pat. No. 3,776,728.

The silver thin film of the lithographic printing plate material after physical development is preferably rendered ink-receptive or enhanced in its ink-receptivity by optional known surface treating agents. These treating agents are such as those which are described in JP-B-48-29723 and U.S. Pat. No. 3,721,559.

Lasers used for exposing the silver thin film to disclose the surface of the hydrophilic layer in the method for making lithographic printing plates according to the present invention include, for example, gas lasers such as carbon dioxide laser, nitrogen laser, Ar laser, He/Ne laser, He/Cd laser and Kr laser, liquid (dye) lasers, solid-state lasers such as ruby laser and Nd/YAG laser, semiconductor lasers such as GaAs/GaAlAs laser and InGaAs laser, and excimer lasers such as KrF laser, XeCl laser, XeF laser and $Ar_2$ laser.

In order to improve the efficiency to expose the hydrophilic layer by accelerating heat fusion of the silver thin film of the lithographic printing plate material (the efficiency can be said to be the sensitivity of the lithographic printing plate material), a light absorber is contained in either of the hydrophilic layer, the support or a layer other than the hydrophilic layer in case the lithographic printing plate material comprises a plurality of layers. This is because even when a part of laser beams transmit the silver thin film, this is absorbed by the underneath layer, whereby the thermal efficiency is improved.

The light absorbers can generally be dyes or pigments such as, for example, carbon black, cyanin, metal-free or metallic phthalocyanine, metallic dithiorene and anthraquinone.

When the light absorber is contained in a metallic support, a chemical or electrochemical metal coloring method can be employed. Especially, in the case of an aluminum support, this support previously subjected to anodization treatment can be dyed by subjecting it to dip dying with organic or inorganic dye to introduce the dye into fine pores of oxide layer, followed by carrying out sealing treatment.

The present invention will be explained in detail by the following nonlimiting examples.

EXAMPLE 1

A matting layer containing silicon dioxide particles having an average particle size of 5 μm was provided on one side of a PET (polyethylene terephthalate) film of 175 μm thick. On another side of the film was coated a coating solution comprising carbon black, silicon dioxide particles having an average particle size of 7 μm, N-methylolethyleneurea as a hardener, gelatin (at 2.5 g/m$^2$) and 100 mg/m$^2$ of a polymer of the formula (1) (where $R_1$ and $R_2$ represent hydrogen atom, n=80 mol %, m=0 mol %, l=0 mol %, average molecular weight: 30,000) to form a hydrophilic layer.

Metallic silver was vapor deposited on the hydrophilic layer at 1 A/sec in a vacuum of 1 mPa or lower by a vacuum deposition apparatus to form a silver thin film of 0.5 μm thick.

The silver thin film corresponding to non-image area was exposed by the following imaging apparatus to disclose the hydrophilic layer to obtain a printing plate. This printing plate was set in an offset printing press (3200MCD manufactured by Ryoubi Imagics Co., Ltd.) and an etch solution (SLM-OH manufactured by Mitsubishi Paper Mills Ltd.) was applied all over the plate surface and printing was carried out. Prints with no toning were obtained at the beginning of printing, but the silver thin film which was image area gradually wore off to cause disappearance of image.

Imaging apparatus:

An external drum type (diameter of drum: 300 mm) using a light source of laser diode with wavelength: 830 nm, output: 550 mW (above the plate surface), and beam diameter: 25 μm (1/e$^2$).

EXAMPLES 2, 3 AND 4

A matting layer containing silicon dioxide particles having an average particle size of 5 μm was provided on one side of a both sides polyethylene coated paper of 135 g/m$^2$.

In a darkroom, on another side of said paper were coated simultaneously an undercoating layer comprising silicon dioxide particles having an average particle size of 7 μm, 2,4-dichloro-6-hydroxy-S-triazine sodium salt as a hardener and gelatin (at 3.5 g/m$^2$) and thereon a silver halide emulsion layer comprising 1.0 g/m$^2$ (in terms of silver nitrate) of silver chloride emulsion (containing 0.8 g/m$^2$ of gelatin) and 80 mg/m$^2$ of N-methylolethyleneurea as a hardener, and then the coat was dried. Among these lithographic printing plate materials, those which contained carbon black in the undercoating layer and the silver halide emulsion layer were referred to as those of Examples 3 and 4, and that which contained no carbon black was referred to as that of Example 2. Thus, three kinds of lithographic printing plate materials were prepared.

Then, a nuclei coating solution comprising palladium sulfide, acrylamide-N-vinylimidazole copolymer (content of imidazole group: 2 mol %, content of amide group: 98 mol %, and average polymerization degree: 1000), hydroquinone, saponin and water was coated on the silver halide emulsion layer of the lithographic printing plate materials of Examples 2 and 3 and the coat was dried. On the lithographic printing plate material of Example 4 was coated a nuclei coating solution which was the same as the above nuclei coating solution except that 4 mg/m$^2$ of a polymer of the formula (1) (where $R_1$ and $R_2$ represent hydrogen atom, n=78 mol %, m=10 mol %, l=2 mol %, average molecular weight: 100,000) was contained in place of the above copolymer, and the coat was dried.

Then, these lithographic printing plates without exposure were subjected to development at 30° C. for 1 minute with the following silver diffusion transfer developer, and then subjected to a treatment at 25° C. for 20 seconds with the following neutralizing solution.

| <Silver diffusion transfer developer> | |
| --- | --- |
| Water | 700 ml |
| Potassium hydroxide | 20 g |
| Anhydrous sodium sulfite | 50 g |
| 2-Mercaptobenzoic acid | 1.5 g |
| 2-Methylamino ethanol | 15 g |
| <Neutralizing solution> | |
| Water | 600 ml |
| Citric acid | 10 g |
| Sodium citrate | 35 g |
| Colloidal silica (20% solution) | 5 ml |
| Ethylene glycol | 5 ml |

Water was added to make up 1 liter in total.

Water was added to make up 1 liter in total.

Then, the area corresponding to non-image area of the above lithographic printing plate materials was exposed with laser beams by the following imaging apparatus to disclose the hydrophilic layer to obtain lithographic printing plates. The imaging was carried out at the same imaging speed. In order to satisfactorily expose the hydrophilic layer, an exposing energy of 830 mJ/cm$^2$ was required for the lithographic printing plate material of Example 2, while 550 mJ/cm$^2$ was necessary for the lithographic printing plate materials of Examples 3 and 4.

Imaging apparatus:

An external drum type (diameter of drum: 300 mm) using a light source of semiconductor laser with avelength: 830 nm, output: 550 mW (above the plate surface), and beam diameter: 25 μm (1/e$^2$).

The resulting lithographic printing plates were set in an offset printing press (3200MCD manufactured by Ryoubi Imagics Co., Ltd.) and an etch solution (SLM-OH manufactured by Mitsubishi Paper Mills Ltd.) was applied all over the plate surface and printing was carried out. In the case of the lithographic printing plates of Examples 2 and 3, water receptivity of the non-image area deteriorated and toning was partially seen after carrying out printing of about 1000 copies, but the image area (silver thin film) sufficiently remained. In the case of the lithographic printing plate of Example 4, good prints with no toning of non-image area could be obtained from the startup of printing until printing of 10,000 copies.

EXAMPLE 5

A nuclei coating solution described in Example 2 of JP-A-53-21602 (containing 4 mg/m$^2$ of No. 3 acrylamide-imidazole copolymer as a hydrophilic polymer) was coated on an aluminum base of 0.3 mm thick subjected to electrolytic graining and anodizing and the coat was dried.

A silver chlorobromide emulsion having an average grain size of 0.28 μm was prepared by simultaneously adding a mixed aqueous solution of sodium chloride and potassium bromide (potassium bromide: 29.5 mol %) and an aqueous silver nitrate solution to an aqueous solution of inert gelatin kept at 60° C. with vigorous stirring, and thereto was added potassium iodide corresponding to 0.5 mol %/1 mol Ag to perform surface conversion. An emulsion layer comprising the above silver halide emulsion grains was coated on the said aluminum support and dried to make a lithographic printing plate material. The silver halide emulsion was a monodispersed silver chloroiodobromide emulsion comprising 70% of silver chloride, 29.5% of silver bromide and 0.5% of silver iodide with 90% by weight of total grains having a size within ±30% of the average grain size.

The thus obtained lithographic printing plate material without exposure was developed with a diffusion transfer developer described in Example 1 of JP-A-4-282295 to which 40 ml/l of N-methylethanolamine was added, and immediately thereafter the gelatin layer was washed off with running water to disclose the silver thin film to obtain a master plate for lithographic printing plate.

The thus obtained master plate for lithographic printing plate of the present invention was exposed by YAG laser of 8 W at a wavelength of 1064 nm to expose the hydrophilic layer. Thus, a lithographic printing plate was obtained. Using this lithographic printing plate, printing of up to 100,000 copies was carried out in the same manner as in Example 4 to obtain prints excellent in print quality with no toning of non-image area.

As explained above, being different from conventional methods for making lithographic printing plates using diazo compounds or photopolymers, the present method for making lithographic printing plates can be carried out even under roomlight and without using developing solution. Therefore, the working environment is very good. Furthermore, a direct imaging method using a laser of low output can be applied, and there are provided excellent effects that images of high resolution can be obtained at low cost.

What is claimed is:

1. A method for making a lithographic printing plate which comprises the following steps:

exposing to heat mode laser a silver thin film of a lithographic printing plate material consisting essentially of a support, at least a hydrophilic layer on the support and a silver thin film as an uppermost layer on the hydrophilic layer, therby to reveal the hydrophilic layer, wherein the silver thin film comprises a physical developement silver produced by silver diffusion transfer process comprising providing a physical development nuclei layer containing a hydrophilic polymer provided on the support and a silver halide emulsion layer provided on the nuclei layer in succession, wherein said material without exposure is subjected to development without fogging by silver diffusion tranfr process and the silver halide emulsion layer is washed off to form the physical development silver thin film, wherein an intermediate laver is not provided between the emulsion layer and the nuclei layer.

2. A method according to claim 1, wherein the physical development nuclei layer and/or a layer contiguous thereto of the lithographic printing plate material contains at least one polymer represented by the following formula (1):

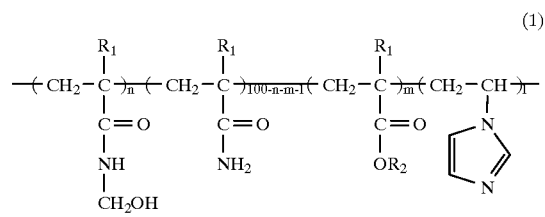

wherein $R_1$ represents a hydrogen atom or an alkyl group, $R_2$ represents a hydrogen atom or an alkali metal atom, n is 1–100 mol %, m is 0–50 mol %, and l is 0–5 mol %, and average molecular weight is 2000–300000.

3. A method according to any of claims 1 and 2, wherein the hydrophilic layer of the lithographic printing plate material contains a light absorber.

4. A method according to claim 2, wherein the physical development nuclei layer and/or a layer contiguous thereto of the lithographic printing plate material contains at least one polymer represented by the following formula (1):

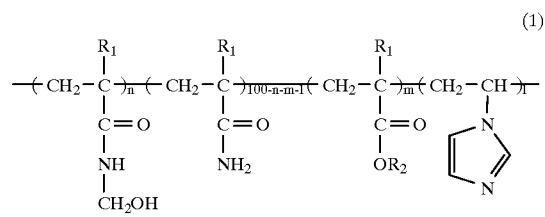

wherein $R_1$ represents a hydrogen atom or an alkyl group, $R_2$ represents a hydrogen atom or an alkali metal atom, n is 1–100 mol %, m is 0–50 mol %, and l is 0–5 mol %, and average molecular weight is 2000–300000.

5. A method according to claim 1, wherein the physical development silver film is formed without thioocyanic acid salt as a solvent for silver halide.

6. A method according to claim 1, wherein the physical development silver film is formed with an amine compound as a solvent for silver halide.

* * * * *